(12) United States Patent
Araki (10) Patent No.: US 6,724,140 B2
(45) Date of Patent: Apr. 20, 2004

(54) ORGANIC LIGHT-EMITTING DEVICE

(75) Inventor: Yasushi Araki, Kanagawa (JP)

(73) Assignee: Fuji Photo Film Co., Ltd., Kanagawa (JP)

( * ) Notice: Subject to any disclaimer, the term of this patent is extended or adjusted under 35 U.S.C. 154(b) by 0 days.

(21) Appl. No.: 10/247,548

(22) Filed: Sep. 20, 2002

(65) Prior Publication Data

US 2003/0136959 A1 Jul. 24, 2003

(30) Foreign Application Priority Data

Sep. 21, 2001 (JP) ........................... P.2001-289299
Aug. 27, 2002 (JP) ........................... P.2002-247117

(51) Int. Cl.$^7$ ................................. H01J 1/62
(52) U.S. Cl. ............... 313/504; 313/501; 313/506; 313/110; 313/111; 313/112; 313/114; 313/116; 313/117; 428/690; 428/917
(58) Field of Search ............... 313/504, 501, 313/506, 110, 111, 112, 114, 116, 117; 428/917, 690

(56) References Cited

U.S. PATENT DOCUMENTS 5,478,658 A * 12/1995 Dodabalapur et al. ...... 428/690
5,949,187 A * 9/1999 Xu et al. ...................... 313/504

FOREIGN PATENT DOCUMENTS

JP    9-180883 A    7/1997

\* cited by examiner

Primary Examiner—Nimeshkumar D. Patel
Assistant Examiner—Holly Harper
(74) Attorney, Agent, or Firm—Birch, Stewart, Kolasch & Birch, LLP (57) ABSTRACT

An organic light-emitting device comprising: a back electrode; an organic light-emitting layer; a transparent electrode; a first reflective mirror; a substrate; and a second reflective mirror in this order, the second reflective mirror having $R_1(\theta=0°)$ of 80 to 100% and $R_2(\theta=0°)$ of 0 to 40%, wherein $R_1(\theta)$ is an average reflectance at a wavelength $\lambda$ being 400 nm to $(\lambda_0-\Delta\lambda)$ (where $\lambda_0$ is a resonance wavelength; and $\Delta\lambda=\lambda max-\lambda_0$, $\lambda max$ is a maximum wavelength that is obtained by measuring reflectance having the same value equal to $R\alpha$ in a wavelength range about 400–700 nm, and $R\alpha$ is an average reflectance at a wavelength range from 400 nm to $(\lambda_0-100)$ nm) at an incidence angle $\theta$, and $R_2(\theta)$ is an average reflectance at a wavelength $\lambda$ is $\lambda_0$ to 700 nm at an incidence angle $\theta$.

26 Claims, 3 Drawing Sheets

Fig. 2-A

Power Efficiency
2.2 lm/w

Power Efficiency
1.1 lm/w

Power Efficiency
0.2 lm/w

Power Efficiency
1.7 lm/w

Power Efficiency
1.8 lm/w

Power Efficiency
1.6 lm/w

ORGANIC LIGHT-EMITTING DEVICE

FIELD OF THE INVENTION

This invention relates to an organic light-emitting device (hereinafter abbreviated as OLED), particularly the device can be used preferably as an optical resonator type organic electroluminescence device with high directionality in light output.

BACKGROUND OF THE INVENTION

Optical resonator type OLEDs are characterized by high directionality showing sharp light emission spectra and are expected to be promising in applications such as liquid crystal projectors, optical telecommunications devices, and exposure sources for printers. Aiming at improved directionality, JP-A-9-180883 (the term "JP-A" as used herein means an "unexamined published Japanese patent application") proposes an OLED comprising a pair of dielectric multilayer reflectors making up a resonator and having an active layer sandwiched therebetween, wherein the resonance wavelength is set in the shorter wavelength than the peak wavelength of the electroluminescence (EL) spectrum thereby to suppress light emitted in directions other than the vertical to the substrate. However, as long as there exists an emission spectrum in the wavelengths shorter than the resonance wavelength, it necessarily follows that shorter wavelength light is emitted with an angle, causing reduction in directionality or emission of light other than the vertical resonance wavelength.

SUMMARY OF THE INVENTION

An object of the present invention is to provide a highly directional OLED.

The object of the present invention is accomplished by:
(1) An organic light-emitting device (OLED) comprising a substrate, a first reflective mirror, a transparent electrode, an organic light-emitting layer (OLE layer), and a back electrode in this order, which has on the reverse of the substrate a second reflective mirror having $R_1$ ($\theta=0°$) of 80 to 100% and $R_2$ ($\theta=0°$) of 0 to 40%, wherein $R_1$ ($\theta$) is an average reflectance at a wavelength $\lambda$ being 400 nm to ($\lambda_0-\Delta\lambda$) (where $\lambda_0$ is a resonance wavelength; and $\Delta\lambda=\lambda\max-\lambda_0$, $\lambda\max$ is a maximum wavelength that is obtained by measuring reflectance having the same value equal to R$\alpha$ in a wavelength range about 400–700 nm. R$\alpha$ is an average reflectance at a wavelength range from 400 nm to ($\lambda_0-100$) nm.) at an incidence angle $\theta$, and $R_2(\theta)$ is an average reflectance at a wavelength $\lambda$ is $\lambda_0$ to 700 nm at an incidence angle $\theta$; and
(2) An organic light-emitting device comprising a substrate, a first reflective mirror, a transparent electrode, an OLE layer, and a back electrode in this order, which has on the reverse of the substrate a second reflective mirror having $d\lambda(\theta)/d\theta$ having an absolute value of 10 or smaller, wherein $\lambda(\theta)$ is a wavelength giving a reflectance ($R_1(\theta)+R_2(\theta)$)/2; and $R_1(\theta)$ and $R_2$ ($\theta$) are as defined above.

The OLEDs of the present invention include the following preferred embodiments.

(3) An OLED according to (2) above, wherein the second reflective mirror has $R_1(\theta=0°)$ of 80 to 100% and $R_2(\theta=0°)$ of 0 to 40%.
(4) An OLED according to any one of (1) to (3) above, wherein the second reflective mirror is smaller in area than the first reflective mirror.
(5) An OLED according to anyone of (1) to (4) above, wherein the OLED further has third to (n+2)'th reflective mirrors having different reflection characteristics formed on the second reflective mirror.
(6) An OLED according to anyone of (1) to (5) above, wherein the substrate has a thickness of 5 $\mu$m to 10 cm.
(7) An OLED according to anyone of (1) to (6) above, wherein at least one of the first and second reflective mirrors is a multilayer thin film.
(8) An OLED according to (5) above, wherein at least one of the third to (n+2)'th reflective mirrors is a multilayer thin film.
(9) An OLED according to (7) or (8) above, wherein a difference between the highest and the lowest of the refractive indices of materials fabricating the multilayer thin film is 1.0 or smaller.
(10) An OLED according to any one of (7) to (9) above, wherein the number of layers making up the multilayer thin film is 6 or greater.
(11) An OLED according to any one of (7) to (10) above, wherein the multilayer thin film is a dielectric multilayer thin film.
(12) An OLED according to any one of (7) to (11) above, wherein the multilayer thin film contains at least one of $ZrO_2$, $Al_2O_3$, $TiO_2$, $SiO_2$, $CeO_2$, $CaF_2$, $LiF$, $MgF_2$, $Na_3AlF_6$, $CeF_2$, $MgO$, $ThO_2$, $SiO$, $Sb_2O_3$, $In_2O_3$, $ZnO$, $SnO_2$, $HfO_2$, $Ta_2O_5$, $ZnS$, $CdS$, $CdTe$, $ZnSe$, $Sb_2S_3$, $Si$, $CdSe$, and $Ge$.
(13) An OLED according to any one of (7) to (12) above, wherein the multilayer thin film contains at least one of $ZrO_2$, $Al_2O_3$, $TiO_2$, and $SiO_2$.
(14) An OLED according to any one of (7) to (13) above, wherein the multilayer thin film contains at least one of $ZrO_2$ and $Al_2O_3$.
(15) An OLED according to any one of (7) to (14) above, wherein the multilayer thin film contains at least one transparent conductive layer.
(16) An OLED according to any one of (7) to (15) above, wherein the multilayer thin film contains at least one of $In_2O_3$, $ZnO$, and $SnO_2$.

BRIEF DESCRIPTION OF THE DRAWING

FIGS. 1-A to 1-F show reflection spectra of the second reflective mirrors used in OLEDs A to F prepared in Examples.

FIGS. 2-A to 2-F show the light intensity profiles (angle dependence of emission intensity) and the power efficiencies of OLEDs A to F prepared in Examples.

DETAILED DESCRIPTION OF THE INVENTION

The OLED according to the present invention comprises a substrate, a first reflective mirror, a transparent electrode, an organic light-emitting layer (OLE layer), and a back electrode in this order. The optical length between the first reflective mirror and the back electrode is set arbitrarily, and light corresponding to the optical length is emitted from the device. Specifically, if the optical length is an integer multiple of half the wavelength $\lambda_0$ (resonance wavelength) of desired light, and the back electrode is mirror-reflective, light having a wavelength $\lambda_0$ vertically resonates between the first reflective mirror and the back electrode and is thus amplified and emitted from the device.

The first reflective mirror can be of any materials having high reflectances. For example, a metal reflective film of silver or aluminum can be used. However, because a metal reflective film absorbs light to cause a light loss, it is advisable to use a reflective mirror formed of a stack of alternating thin layers of two dielectrics having different refractive indices. Where such a thin multilayer dielectric film is used as a first reflective mirror, the optical length L between the first reflective mirror and the back electrode is given by the following equation which takes into account the light penetration depth into the inside of the thin multilayer reflective film.

$$L = \frac{\lambda_0}{2}\left(\frac{n_{\mathit{eff}}}{\Delta n}\right) + \sum n_i d_i \cos\theta_i \quad (1)$$

where $\lambda_0$ is a resonance wavelength; $n_{\mathit{eff}}$ is the effective refractive index of a thin multilayer reflective film; $\Delta n$ is a difference in refractive index between the two layers making up the thin multilayer reflective film; $n_i$ and $d_i$ are the refractive index and the thickness, respectively, of an organic compound layer(s) and a transparent electrode; and $\theta_i$ is the angle between light incident on the interface between OLE layers or between an OLE layer and the transparent electrode layer and the normal of the interface. An optical resonator type OLED is obtained by setting the optical length L at an integer multiple of half the resonance wavelength $\lambda_0$.

As is obvious from equation (1), the optical length L has angle dependence, showing a decrease with an increase of the angle $\theta_i$. As a result, in an optical resonator type device, shorter wavelength light is resonated and emitted in a direction at an angle with the normal of the light-emitting surface of the device, which light reduces directionality, an important characteristic of an OLED.

According to the present invention, the directionality in light output can be improved by providing a second reflective mirror on the reverse of the substrate, the second reflective mirror having at least one of: <1> $R_1(\theta=0°)$ of 80 to 100% and $R_2(\theta=0°)$ of 0 to 40%; and <2> $d\lambda(\theta)/d\theta$ having an absolute value of 10 or smaller, wherein $\lambda(\theta)$ is a wavelength giving a reflectance $(R_1(\theta)+R_2(\theta))/2$, wherein $R_1(\theta)$ is an average reflectance at a wavelength $\lambda$ being 400 nm to $(\lambda_0-\Delta\lambda)$ (where $\lambda_0$ is a resonance wavelength; and $\alpha\lambda=\lambda\max-\lambda_0$, $\lambda\max$ is a maximum wavelength that is obtained by measuring reflectance having the same value equal to R$\alpha$ in a wavelength range about 400–700 nm. R$\alpha$ is an average reflectance at a wavelength range from 400 nm to $(\lambda_0-100)$ nm; $\Delta\lambda$ is preferably from 0.1 to 100 nm) at an incidence angle $\theta$, and $R_2(\theta)$ is an average reflectance at a wavelength $\lambda$ is $\lambda_0$ to 700 nm at an incidence angle $\theta$. In order to improve the directionality, moreover, a second reflective mirror having both of: <1> $R_1(\theta=0°)$ of 80 to 100% and $R_2(\theta=0°)$ of 0 to 40%; and <2> $d\lambda(\theta)/d\theta$ having an absolute value of 10 or smaller, wherein $\lambda$ ($\theta$) is a wavelength giving a reflectance $(R_1(\theta)+R_2(\theta))/2$ should be provided on the reverse of the substrate.

Reflective conditions with respect to the above-described items <1> and <2> will be further illustrated in greater detail with reference to the following embodiments, which are, however, not to be construed, of course, as limiting the invention.

With the $\Delta\lambda$ being 0.1 nm, where the average reflectance $R_1(\theta=0°)$ at 400 nm$\leq\lambda\leq(\lambda_0-0.1)$ nm at an incidence angle 0° is from 80 to 100%, the condition that the average reflectance $R_1(\theta=0°)$ at 400 nm$\leq\lambda(\lambda_0-1)$ nm at an incidence angle 0° is from 80 to 100% is also fulfilled when $\Delta\lambda$ is 1 nm. Therefore, the latter case is included under the case of $\Delta\lambda=0.1$ nm. With a smaller $\Delta\lambda$, directionality is improved but the output light quantity is reduced. A greater $\Delta\lambda$ results in reduced directionality (i.e., reduced effects of the invention). Accordingly, a preferred range of $\Delta\lambda$ is 0.1 to 50 nm, particularly 1 to 30 nm, especially 2 to 15 nm.

The $R_1$ ($\theta=0°$) is preferably 90 to 100%, still preferably 95 to 100%, particularly preferably 99 to 100%. The $R_2(\theta=0°)$ is preferably 0 to 20%, still preferably 0 to 10%, particularly preferably 0 to 2%. The $R_2(\theta=0°)$ is preferably 0 to 20%, still preferably 0 to 10%, particularly preferably 0 to 2%.

Where the incidence angle $\theta$ is not zero degree, the above-defined conditions for $\theta=0°$ are preference. That is, it is preferred that $R_1(\theta)$, which is an average reflectance at a wavelength being 400 nm to $(\lambda'_0-\Delta\lambda)$ nm (where $\lambda'_0$ is a resonance wavelength, which usually differs from the resonance wavelength $\lambda_0$ for $\theta=0°$; and $\Delta\lambda=\lambda\max-\lambda_0$, $\lambda\max$ is a maximum wavelength that is obtained by measuring reflectance having the same value equal to R$\alpha$ in a wavelength range about 400–700 nm. R$\alpha$ is an average reflectance at a wavelength range from 400 nm to $(\lambda_0-100)$ nm; $\Delta\lambda$ is preferably from 0.1 to 100 nm) at an incidence angle $\theta$ ($\neq 0°$)), be from 80 to 100% and that $R_2(\theta)$, which is an average reflectance at 700 nm$\geq\lambda\geq\lambda'_0$ at an incidence angle $\theta$ ($\neq 0°$) be from 0 to 40%.

In another aspect of the present invention, there is provided a highly directional OLED in which the second reflective mirror has $d\lambda(\theta)/d\theta$ preferably having an absolute value of 10 or smaller wherein $\lambda(\theta)$ is a wavelength giving a reflectance $(R_1(\theta)+R_2(\theta))/2$. The $|d\lambda(\theta)/d\theta|$ is preferably 5 or smaller, still preferably 2.5 or smaller, more still preferably 1 or smaller, further more preferably 0.5 or smaller. If the $|d\lambda(\theta)/d\theta|$ is greater than 10, light with an angle is liable to pass through the second reflective mirror, resulting in reduction of directionality of the device.

A second reflective mirror is made so as to have <1> $R_1(\theta=0°)$ of 80 to 100% and $R_2(\theta=0°)$ of 0 to 40%; and/or <2> $d\lambda(\theta)/d\theta$ having an absolute value of 10 or smaller, wherein $\lambda(\theta)$ is a wavelength giving a reflectance $(R_1(\theta)+R_2(\theta))/2$, as described above. Use of a metallic thin film is an effective method to reduce the $|d\lambda(\theta)/d\theta|$. Such a metallic thin film is conceivably made of Al, Ag, Au, Pt, Mg, Cr, Ca, etc. However, many of these materials absorb visible light to reduce the external quantum efficiency and to yield insufficient illumination. Therefore, it is necessary to select suitable materials. In this respect, multilayer thin film (dielectric multilayer films) made of dielectrics that do not absorb light are preferred. Nevertheless commonly used dielectric multilayer films almost necessarily have a large $|d\lambda(\theta)/d\theta|$. As described above, to make $|d\lambda(\theta)/d\theta|$ that is included by the above-described condition <2> smaller (10 or smaller) and to meet other conditions as a light-emitting device are difficult in general. However, according to the present invention, to the contrary, it is seen that the $|d\lambda(\theta)/d\theta|$ can be made smaller by tactically controlling the refractive characteristics of the dielectric multilayer film. For example, it is very effective, while difficult, to make the difference in refractive index between materials fabricating a dielectric multilayer film as small as possible to thereby increase the reflectance, as a result, the $|d\lambda(\theta)/d\lambda|$ can be decreased. Concretely, dielectric multilayer film often has an alternate film structure fabricated of at least one high-refractive index material and at least one low-refractive index material. The highest refractive index of the high-refractive index materials taken as n1 and the lowest refractive index of the low-refractive index materials taken as n2, it is desirable that the difference, n1−n2, be as small as possible. Accordingly, it is preferred in the present invention that the difference n1−n2 be 1.0 or smaller, desirably 0.8 or smaller, more desirably 0.7 or smaller, still more desirably 0.6 or smaller, particularly 0.55 or smaller, especially 0.40 or smaller. Lower limit of the difference n1−n2 is not particularly limited, but, is preferably 0.3 or larger.

Above-described conditions <1> and<2> could be achieved by fabricating the second reflective mirror containing a multilayer thin film with alterations to the optical lengths of layers. Such manipulation cannot be generalized because the results heavily depend on film forming equipment and conditions. To taken an instance, where the second reflective mirror of the present invention has a multilayer thin film structure having optical lengths $\lambda_0/8$, $\lambda_0/4$, and $\lambda_0/8$ ($\lambda_0$: resonance wavelength), reduction of the $|d\lambda(\theta)/d\theta|$ can sometimes be achieved by such adjustment that the optical lengths of the layers formed in the first half stage and the second half stage of film formation are made a little longer while the optical length or lengths of one or two layers just in the middle is/are made a little shorter. It is supremely difficult to define the conditions for successfully carry out this technique because a success depends on various factors such as film forming conditions.

In order to obtain a preferred second reflective mirror with a multilayer thin film structure, the greater the number of the layers to be stacked, the better the results. A number of the layers is preferably 6 or greater, still preferably 15 or greater, particularly preferably 35 or grater, especially preferably 60 or greater.

It is very favorable that the second reflective mirror is a dielectric multilayer film fabricated of dielectric materials, as mentioned above. Preferred dielectric materials include, but are not limited to, $ZrO_2$, $Al_2O_3$, $TiO_2$, $SiO_2$, and among them, $ZrO_2$ and $Al_2O_3$ are particularly preferable. Preferred dielectric materials further include $CeO_2$, $CaF_2$, LiF, $MgF_2$, $Na_3AlF_6$, $CeF_2$, MgO, $ThO_2$, SiO, $Sb_2O_3$, $In_2O_3$, ZnO, $SnO_2$, $HfO_2$, $Ta_2O_5$, ZnS, CdS, CdTe, ZnSe, $Sb_2S_3$, Si, CdSe, and Ge. Particularly preferred of them are $ZrO_2$, $Al_2O_3$, $TiO_2$, and $SiO_2$. Those having such electric characteristics as to provide a transparent conductive film, such as $In_2O_3$, ZnO, and $SnO_2$, are still preferred for their capability of performing the function as an electrode combined with the function as a reflective mirror.

The device of the present invention having the above-mentioned second reflective mirror is essentially differs from a structure merely having a filter disposed on a light-emitting surface. Light emitted from a structure with a filter will be absorbed by the filter. Since the OLED of the present invention has the second reflective mirror on the reverse of the substrate, i.e., the light-emitting side of the substrate, light having a wavelength other than the resonance wavelength at $\theta=0°$ is reflected toward the inside of the substrate, propagated in the substrate, and can be taken out as output light.

Light of a certain wavelength which is propagated inside the substrate can be emitted under desired conditions by making the area of the second reflective mirror smaller than that of the first reflective mirror or by superposing "n" reflective mirrors (a third, a fourth, . . . and an (n+2)'th reflective mirrors) having different reflection characteristics on the second reflective mirror. The number "n" is not limited as long as light having desired wavelengths may be taken out and can be changed according to the reflection characteristics of each reflective mirror. While the materials of the third to the (n+2)'th reflective mirrors are not particularly limited, thin multilayer reflective films having a stack of a combination of layers different in refractive index are preferably used by a reason as in the second reflective mirror.

In order to obtain more output light, it is a conceivable manipulation to provide a material that couples light rays in intimate contact with the substrate.

Figure 3:
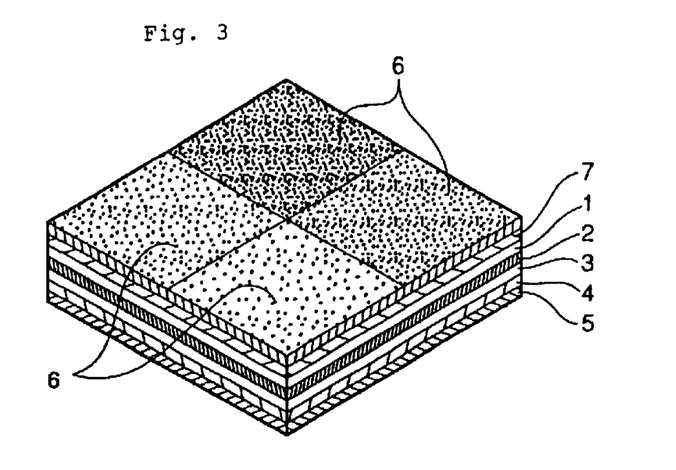
FIG. 3 is a perspective of an OLED according to the present invention.
Figure 4:
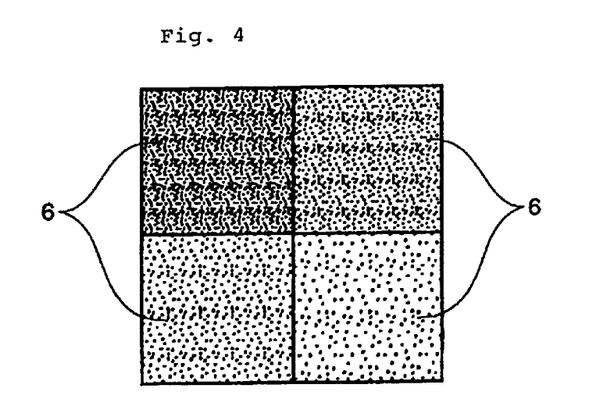
FIG. 4 is a plan of the OLED of FIG. 3.
Figure 5:
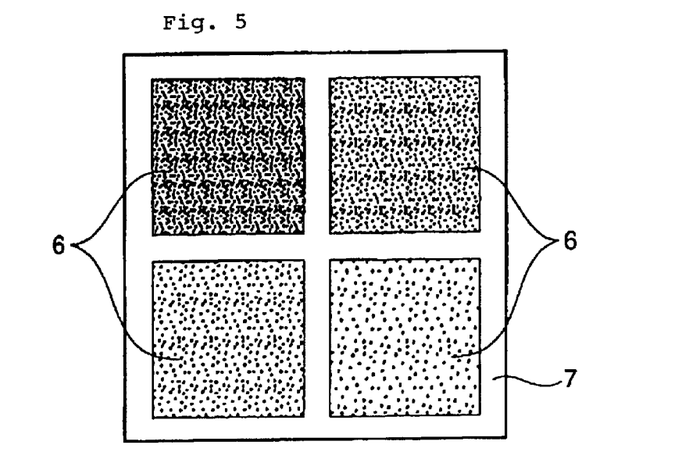
FIG. 5 is a plan of a modification of the OLED shown in FIG. 3.

FIG. 3 shows one embodiment of the OLED according to the present invention, the plan of which is shown in FIG. 4. The device of FIG. 3 comprises a substrate 1, a first reflective mirror 2, a transparent electrode 3, an OLE layer 4, and a back electrode 5 in the order described, further has a second reflective mirror 7 on the reverse side of the substrate 1 (opposite to the first reflective mirror side), and additionally has a third to an (n+2)'th (n=4 in the embodiment shown) mirrors, all indicated by numeral 6, on the second reflective mirror 7. The reflective mirrors 6 having different reflection characteristics, light rays having desired wavelengths are emitted from the respective reflective mirrors 6. FIG. 5 illustrates a modification of the OLED shown in FIGS. 3 and 4, in which light of desired wavelengths can be taken out from not only the third to the (n+2)'th mirrors but the second reflective mirror 7. As is understood from these embodiments, the present invention makes it possible to obtain light of different wavelengths from one device by altering the configuration or reflection characteristics of the second reflective mirror and the third to (n+2)'th reflective mirrors.

The thickness of the substrate is preferably 5 $\mu$m to 10 cm, still preferably 10 $\mu$m to 1 cm, particularly preferably 30 $\mu$m to 0.5 mm, especially preferably 100 $\mu$m to 0.2 mm. If the substrate is too thin, complex resonance can occur between the second reflective mirror and the first reflective mirror and/or between the second reflective mirror and the back electrode, which depends on the optical length therebetween. Since the device of the present invention does not involve laser resonance, complex resonance is prevented by a thick substrate.

The multilayer reflective films used as the first and/or third to (n+2)'th reflective mirrors can have any layer structure of choice as long as the reflectance conditions of the present invention are basically satisfied. Typical are multilayer dielectric films composed of low-refractive index materials and high-refractive index materials, in which each layer has a thickness of ¼ the resonance wavelength $\lambda_0$, or a layer having a thickness of ⅛ $\lambda_0$ and a layer having a thickness of ¼ $\lambda_0$ alternate in the order of (⅛ layer)/(¼ layer)/(⅛ layer), or a layer having a thickness of ¼ $\lambda_0$ and a layer having a thickness of ¾ $\lambda_0$ alternate in the order of (¼ layer)/(¾ layer)/(¼ layer). Combinations of these layer structures or any other structures are usable. Materials which are often used to fabricate the reflective mirrors include $SiO_2$, $TiO_2$, $Al_2O_3$, $MgF_2$, and $ZrO_2$. Metals and polymers are also useful.

Each of the first, second, third to (n+2)'th reflective mirrors usually has a thickness of several tens to several hundreds of nanometers.

The layer structure between the transparent electrode and the back electrode will be described hereunder. The OLE layer is a light-emitting layer made of an organic compound emitting fluorescence including phosphorescence. If necessary, an electron transport layer or a hole transport layer can be provided between the OLE layer and the electrodes. For example, a structure [transparent electrode (or back electrode)/OLE layer/electron transport layer/back electrode (or transparent electrode)] and a structure [transparent electrode (or back electrode)/hole transport layer/OLE layer/electron transport layer/back electrode (or transparent electrode) are conceivable. A plurality of the OLE layers or a plurality of the hole transport layers may be provided. A hole injection layer or an electron injection layer may also be provided.

Hereinafter, the term of derivative means its compound and derived thereof. For example, oxadiazole derivatives mean oxadiazole and its derivatives.

Electron transport materials which can be used in the electron transport layer include, but are not limited to, such organic compounds as oxadiazole derivatives, triazole derivatives, triazine derivatives, nitro-substituted fluorenone derivatives, thiopyran dioxide derivatives, diphenylquinone derivatives, perylenetetracarboxylic acid derivatives, anthraquinodimethane derivatives, fluorenylidenemethane derivatives, anthrone derivatives, perynone derivatives, oxine derivatives, and quinoline complex derivatives.

It is highly advisable to provide a thin insulator film as an electron injection layer. Preferred electron injection layers include, but are not limited to, an aluminum oxide or lithium fluoride layer having a thickness of about 0.1 to 10 nm.

Hole transport materials which can be used in the hole transport layer include polymers such as poly-N-vinylcarbazole, polyphenylene vinylene derivatives, polyphenylene, polythiophene, polymethylphenylsilane, and polyaniline; triazole derivatives, oxadiazole derivatives, imidazole derivatives, polyarylalkane derivatives, pyrazoline derivatives, pyrazolone derivatives, phenenediamine derivatives, arylamine derivatives, amino-substitutedchalcone derivatives, oxazole derivatives, carbazole derivatives, styrylanthracene derivatives, fluorenone derivatives, hydrazone derivatives, stilbene derivatives, porphyrin derivatives such as phthalocyanine, aromatic tertiary amine compounds, styrylamine compounds, butadiene compounds, benzidine derivatives, polystyrene derivatives, triphenylmethane derivatives, tetraphenylbenzene derivatives, and starburst polyamine derivatives.

Any organic compounds which are excited to emit fluorescence can be used to make the OLE layer with no particular restriction. Useful light-emitting compounds include oxinoid compounds, perylene compounds, coumarin compounds, azacoumarin compounds, oxazole compounds, oxadiazole compounds, perinone compounds, pyrrolopyrrole compounds, naphthalene compounds, anthracene compounds, fluorenone compounds, fluoranthene compounds, tetracene compounds, pyrene compounds, coronene compounds, quinolone compounds, azaquinolone compounds, pyrazoline derivatives, pyrazolone derivatives, rhodamine compounds, chrysene compounds, phenanthrene compounds, cyclopentadiene compounds, stilbene compounds, diphenylquinone compounds, styryl compounds, distyrylbenzene compounds, butadiene compounds, dicyanomethylenepyran compounds, dicyanomethylenethiopyran compounds, fluorescein compounds, pyrylium compounds, thiapyrylium compounds, selenapyrylium compounds, telluropyrylium compounds, aromatic aldazine compounds, oligophenylene compounds, xanthene compounds, thioxanthene compounds, cyanine compounds, acridine compounds, acridone compounds, quinoline compounds, 8-hydroxyquinolinatometal complexes, benzoquinolinol beryllium complex, 2,2'-bipyridine compound metal complexes, complexes between Schiff bases and the group III metals, metal complexes of oxadiazole compounds, and rare earth element complexes.

It is particularly desirable for the OLE layer to contain an ortho-metalated complex for obtaining improved luminescence efficiency. "Ortho-metalated complex" is a generic term designating a group of compounds described, e.g., in Yamamoto Akio, Yukikinzokukagaku-kiso to ohyo, Shokabo Publishing Co. (1982), p. 150 and p. 232 and H. Yersin, *Photochemistry and Photophysics of Coordination Compounds*, Springer-Verlag (1987), pp. 71–77 and 135–146. Various ligands can provide ortho-metalated complexes as recited in the above literature. Examples of preferred ligands are 2-phenylpyridine derivatives, 7,8-benzoquinoline derivatives, 2-(2-thienyl)pyridine derivatives, 2-(1-naphthyl)pyridine derivatives, and 2-phenylquinoline derivatives. These derivatives may have substituents according to necessity. The center metal of the ortho-metalated complexes include iridium, palladium, and platinum. Iridium complexes are particularly preferred. The ortho-metalated complex may contain other ligands in addition to the ligands forming an ortho-metalate. The ortho-metalated complexes useful in the invention include those capable of emitting light from the triplet excitons, which compounds are preferred for securing improved luminescence efficiency.

These light-emitting materials can be used either individually or as a combination of two or more thereof. Also employable are high-molecular weight light-emitting materials including n-conjugated polymers, such as poly-p-phenylene vinylene derivatives, polyfluorene derivatives, and polythiophene derivatives; and polymers having a low-molecular dye and tetraphenyldiamine or triphenylamine introduced to the main or side chain thereof. A mixed system of a high-molecular material and a low-molecular material is useful as well.

An electrically conductive polymer layer may be provided between the transparent electrode and the OLE layer (or a hole transport layer if provided between the transparent electrode and the OLE layer) and in contact with the transparent electrode. A conductive polymer layer will allow an increased thickness of the organic compound layers with little increase in driving voltage thereby preventing brightness unevenness or shortage. Preferred conductive polymers include polyaniline derivatives, polythiophene derivatives and polypyrrole derivatives described in WO 98/05187. These derivatives can be used as mixed with protonic acids, such as comphorsulfonic acid, p-toluenesulfonic acid, styrenesulfonic acid, and polystyrenesulfonic acid. If desired, the derivatives can be used as mixed with other polymers, such as polymethyl methacrylate (PMMA) and poly-N-vinylcarbazole (PVCz). The conductive polymer layer preferably has a surface resistivity of 10,000 $\Omega$/square or less and a thickness of 10 to 1000 nm, particularly 20 to 200 nm.

The organic compound layers such as the hole transport layer, the electron transport layer, the OLE layer, and the conductive polymer layer are formed by known methods, such as vacuum evaporation, sputtering, dip coating, spin coating, casting, bar coating, and roll coating. Simultaneous coating is made feasible by properly selecting solvents.

While the optical length between the first reflective mirror and the back electrode is not particularly limited as far as it is an integer multiple of half a desired resonance wavelength and unless the function of each organic layer existing therebetween is not impaired, the integer multiplier for half the resonance wavelength is usually from 1 to 10, preferably 2 to 8, still preferably 3 to 6.

Materials of the transparent electrode include tin oxide, indium-tin oxide (ITO), and indium-zinc oxide as are well known in the art. A thin film of metal having a large work function, such as gold or platinum, can also be used. The transparent electrode may be of organic materials such as polyaniline, polythiophene, polypyrrole, and their derivatives. The details of transparent conductive films are described in Sawada Yutaka (Ed.), Tomei Dodenmakuno Shin-tenkai, CMC (1999), which are applicable to the present invention.

The back electrode should be of materials which reflect light as a mirror of an optical resonator. From the standpoint of electron injecting performance, materials having a small work function, such as alkali metals, e.g., Li and K, and alkaline earth metals, e.g., Mg and Ca, are suitable. Materials that are insusceptible to oxidation and stable, such as Al, are also suitable. The back electrode may be formed of two or more materials selected to achieve both stability and electron injecting properties. For the details of the materials to be combined refer to JP-A-2-15595 and JP-A-5-121172.

A protective layer may be formed on the back electrode on the side opposite to the organic compound layers so as to avoid moisture or air entering. For the details of the protective layer for this purpose reference can be made in JP-A-7-85974. It is advisable to seal the electrodes with glass frit or a poly(chlorotrifluoroethylene) sheet. A desiccant, a water-repellant fluorine type inert liquid, etc. may be incorporated into the sealant.

The inorganic layers such as the transparent electrode and the back electrode are formed by sputtering, ion plating or a like known technique.

The substrate of the OLED includes a glass plate and a plastic plate. Plastic substrates should have heat resistance, dimensional stability, solvent resistance, electrical insulating properties, processability, low air permeability, and low moisture absorption. Such plastic materials include polyethylene terephthalate, polybutylene terephthalate, polyethylene naphthalate, polystyrene, polycarbonate, polyether sulfone, polyarylate, allyl diglycol carbonate, and polyimide. A moisture proof layer (gas barrier layer) is preferably provided on either side of the substrate. An inorganic layer of silicon nitride, silicon oxide, etc. is a preferred moisture-proof (gas barrier) layer, which can be formed by, for example, radiofrequency sputtering. If necessary, a hard coat layer or an undercoat layer may be provided on the substrate.

The OLED is usually provided with a sealing layer for preventing moisture or oxygen from entering each layer constituting the device. Useful sealing materials include copolymers comprising tetrafluoroethylene and at least one comonomer, fluorine-containing copolymers having a cyclic structure in the copolymer main chain, copolymers comprising two or more monomers providing polyethylene, polypropylene, polymethyl methacrylate, polyimide, polyurea, polytetrafluoroethylene, polychlorotrifluoroethylene, polydichlorodifluoroethylene, chlorotrifluoroethylene, and dichlorodifluoroethylene, water-absorbing substances having a water absorption of 1% or more and a moistureproof substances having a water absorption of 0.1% or less, metals, e.g., In, Sn, Pb, Au, Cu, Ag, Al, Ti, and Ni, metal oxides, e.g., MgO, SiO, $SiO_2$, $Al_2O_3$, GeO, NiO, CaO, BaO, $Fe_2O_3$, $Y_2O_3$, and $TiO_2$, metal fluorides, e.g., $MgF_2$, LiF, $AlF_3$, and $CaF_2$, liquid fluorinated carbons, e.g., perfluoroalkanes, perfluoroamines, and perfluoroethers, and the liquid fluorinated carbons having dispersed therein a moisture- or oxygen-adsorbent.

The electrode can be patterned either by chemical etching, such as photolithography, or by physical etching using a laser, etc. A patterned electrode may be formed by vacuum evaporation or sputtering through a mask. The OLED of the present invention is, while usable with a single pixel, preferably used in the form of a plurality of dot arrays each for each luminescence color. A single line or a plurality of lines may be used for each color. A single pixel size is from 10 to 500 μm, preferably 50 to 300 μm.

EXAMPLES

A glass substrate of 5.0 cm×5.0 cm×0.7 mm (t) was ultrasonically cleaned in acetone, Semico-Clean (available from Furuuchi Chemical Corp.), and isopropyl alcohol (IPA), boiled in IPA, and $UV/O_3$ cleaned. The thus treated glass substrate was designated substrate A.

Figure 1:
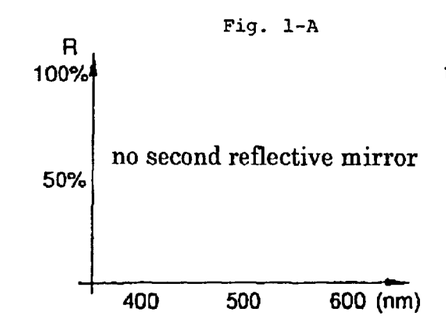

A multilayer reflective film (second reflective mirror) having the reflection spectrum shown in FIGS. 1-A to 1-F (represented in three wavelength regions of $\lambda \leq \lambda_0 - \Delta\lambda$, $\lambda_0 - \Delta\lambda \leq \lambda \leq \lambda_0$, and $\lambda_0 \leq \lambda$) was formed on substrate A by electron beam deposition using the materials shown in Table 1 according to the layer configuration shown to prepare substrates B to G and D', D", D"', and D"" (Figures which show reflection spectra of the substrates G, D', D", D"', and D"" are omitted). A ¼λ multilayer reflective film (first reflective mirror) which is fabricated by $TiO_2$, $SiO_2$ and the like (if the film is fabricated by other materials, an effect of the invention can be maintained), the non-transmitting zone (a wavelength range in which high reflectances are shown) of which was centered at 540 nm was formed on one side of substrate A (with no second reflective mirror) and on the opposite side of the other substrates. An ITO layer (transparent electrode) was formed on the first reflective mirror by sputtering to a deposit thickness of 0.18 μm.

On the first reflective mirror side of each substrate were stacked the following layers in the order described to fabricate OLEDs, which are designated samples A to G, D', D", D"', and D"" respectively.

(a) Hole transport layer:
4,4'-bis [N-(1-naphthyl)-N-phenylamino]biphenyl (NPD), vacuum evaporated at a deposition rate of 0.3 to 0.4 nm/sec to a deposit thickness of 40 nm.

(b) OLE layer: compound 1, vacuum evaporated at a deposition rate of 0.3 to 0.4 nm/sec to a deposit thickness of 20 nm.

Compound 1:

(c) OLE layer: Tris(8-quinolilato)aluminum (Alq), vacuum evaporated at a deposition rate of 0.3 to 0.6 nm/sec to a deposit thickness of 40 nm.

(d) Back electrode (cathode): Mg/Ag=10/1 (by mole), vacuum evaporated to a deposit thickness of 0.6 μm.

(e) Ag layer; Ag, vacuum evaporated to a deposit thickness of 0.5 μm.

In all the OLEDs prepared, the resonance wavelength $\lambda_0$ was adjusted at 540 nm (green light), and the optical length between the first reflective mirror and the back electrode was set at an integer multiple of half of 540 nm according to equation (1), taking into consideration the thicknesses and refractive indices of the transparent electrode, the hole transport layer, and the OLE layers, and the penetration depth into the first reflective mirror.

The angle dependence of light intensity (angles: 0°, 15°, 30°, 45°, 60°, and 75°) and the power efficiency of the resulting OLEDs were examined. The results obtained from samples A to F are shown in FIGS. 2-A to 2-F and Table 2.

Figure 2:
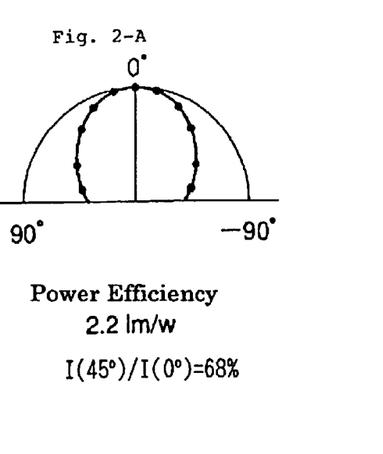

With reference to samples G, D', D", D'" and DΔΔ, the results of which are not shown in FIGS. 2-A to 2-F, considerations were made from the results shown in Table 2. In Table 2, "I(45°)/I(0°) " is a ratio of the light intensity I(45°) measured at an angle of 45° from the normal of the substrate to the light intensity I(0°) measured at an angle of 0° from the normal. The smaller the I(45°)/I(0°), the higher the directionality.

TABLE 1

| Sample | High-refractive Index Material | n1 | Low-refractive Index Material | n2 | n1 − n2 | Number of Layers |
|---|---|---|---|---|---|---|
| A | | | No second reflective mirror | | | |
| B | $Al_2O_3$ | 1.70 | $SiO_2$ | 1.40 | 0.30 | 54 |
| C | $Al_2O_3$ | 1.70 | $SiO_2$ | 1.40 | 0.30 | 54 |
| D | $Al_2O_3$ | 1.70 | $SiO_2$ | 1.40 | 0.30 | 54 |
| E | $CeO_2$ | 2.45 | $CaF_2$ | 1.30 | 1.15 | 12 |
| F | $Al_2O_3$ | 1.70 | $SiO_2$ | 1.40 | 0.30 | 74 |
| G | $SnO_2$ | 2.30 | $In_2O_3$ | 2.00 | 0.30 | 60 |
| D' | $ZrO_2$ | 2.20 | $Al_2O_3$ | 1.70 | 0.50 | 44 |
| D" | $ZrO_2$ | 2.20 | $SiO_2$ | 1.40 | 0.80 | 38 |
| D'" | $TiO_2$ | 2.40 | $SiO_2$ | 1.40 | 1.00 | 24 |
| D"" | $TiO_2$ | 2.40 | $SiO_2$ | 1.40 | 1.00 | 4 |

TABLE 2

| Sample | Δλ | dλ (θ)/dθ | I (45°)/I (0°) | Power Efficiency (lm/W) |
|---|---|---|---|---|
| D | 5 | 0.3 | 0% | 1.7 |
| D' | 5 | 0.8 | 0% | 1.7 |
| D" | 5 | 1.3 | 10% | 1.7 |
| D'" | 5 | 1.8 | 29% | 1.8 |
| E | 5 | 2.2 | 56% | 1.8 |
| G | 5 | 0.3 | 0% | 1.7 |
| D"" | 5 | 2 | 60% | 1.9 |

The results shown in FIGS. 2-A to 2-F and Table 2 reveal the following.

Sample B represents an improvement over sample A in directionality which is brought about by the second reflective mirror according to the present invention. Sample C with a smaller Δλ exhibits further improved directionality but a reduced power efficiency. In view of the balance between power efficiency and directionality, it is understood that a preferred Δλ value is that of sample D.

The dλ(θ)/dθ values, which indicate the angle dependence of the second reflective mirror, are shown in Table 2. It is seen that directionality is improved according as the dλ(θ)/dθ value becomes smaller in the order of samples E, D"", D'", D", D' and D. It is also seen that similar effects are produced with such a transparent conductive film as in sample G, which is a preferred embodiment considering that the film could serve as an electrode. In case of sample D"" wherein number of layers is extremely small, the directionality is improved compared with sample A having no second reflective mirror, but, the performance get worse compared with sample D'" wherein number of layers is large.

Returning to FIGS. 1-A to 1-F, it is demonstrated that higher directionality than in sample D is observed with sample F, in which the average reflectance $R_1(\theta)$ at 400 nm$\leq \lambda \leq (\lambda_0 - \Delta\lambda)$ nm ($\Delta\lambda = 0.1$ nm) at an incidence angle θ of 0° is closer to 100% than that of sample D.

It is obvious that light can be emitted from the areas other than the device by making the area of the second reflective mirror smaller than that of the first reflective mirror or by providing a third mirror as illustrated in FIG. 3.

While the effects of the present invention have been tested on the OLEDs which emit green light ($\lambda_0 = 540$ nm), it is easily anticipated that similar results would be obtained from other OLEDs fabricated by using emitting materials in blue, red, and other colors or by using other various organic materials as constituent elements.

The present invention provides a highly directional OLED, particularly an optical resonator type OLED with improved directionality by suppressing emission of light having shorter wavelengths than the resonance wavelength.

This application is based on Japanese Patent application JP 2002-247117, filed Aug. 27, 2002, the entire content of which is hereby incorporated by reference, the same as if set forth at length.

What is claimed is:

1. An organic light-emitting device comprising:

a back electrode;

an organic light-emitting layer;

a transparent electrode;

a first reflective mirror;

a substrate; and a second reflective mirror in this order, the second reflective mirror having $R_1(\theta=0°)$ of 80 to 100% and $R_2(\theta=0°)$ of 0 to 40%, wherein $R_1(\theta)$ is an average reflectance at a wavelength λ being 400 nm to ($\lambda_0 - \Delta\lambda$) (where $\lambda_0$ is a resonance wavelength; and $\Delta\lambda = \lambda max - \lambda_0$, λmax is a maximum wavelength that is obtained by measuring reflectance having the same value equal to Rα in a wavelength range about 400–700 nm, and Rα is an average reflectance at a wavelength range from 400 nm to ($\lambda_0 - 100$) nm) at an incidence angle θ, and $R_2(\theta)$ is an average reflectance at a wavelength λ is $\lambda_0$ to 700 nm at an incidence angle θ.

2. An organic light-emitting device comprising:

a back electrode;

an organic light-emitting layer;

a transparent electrode;

a first reflective mirror;

a substrate; and a second reflective mirror in this order, the second reflective mirror having dλ(θ)/dθ having an absolute value of 10 or smaller, wherein λ(θ) is a wavelength giving a reflectance $(R_1(\theta)+R_2(\theta))/2$; $R_1(\theta)$ is an average reflectance at a wavelength λ being 400 nm to ($\lambda_0 - \Delta\lambda$) (where $\lambda_0$ is a resonance wavelength; and $\Delta\lambda = \lambda max - \lambda_0$, λmax is a maximum wavelength that is obtained by measuring reflectance having the same value equal to Rα in a wavelength range about 400–700 nm, and Rα is an average reflectance at a wavelength range from 400 nm to ($\lambda_0 - 100$) nm) at an incidence angle θ, and $R_2(\theta)$ is an average reflectance at a wavelength λ is $\lambda_0$ to 700 nm at an incidence angle θ.

3. The organic light-emitting device of claim 1, further comprising third to (n+2)'th reflective mirrors having different reflection characteristics formed on the second reflective mirror.

4. The organic light-emitting device of claim 1, wherein the substrate has a thickness of 5 μm to 10 cm.

5. The organic light-emitting device of claim 1, wherein at least one of the first and second reflective mirrors is a multilayer thin film.

6. The organic light-emitting device of claim 3, wherein at least one of the third to (n+2)'th reflective mirrors is a multilayer thin film.

7. The organic light-emitting device of claim 5, wherein a difference between the highest and the lowest of refractive indices of materials fabricating the multilayer thin film is 1.0 or smaller.

8. The organic light-emitting device of claim 5, wherein a number of layers making up the multilayer thin film is 6 or greater.

9. The organic light-emitting device of claim 5, wherein at least one of layers making up the multilayer thin film comprises at least one of $ZrO_2$ and $Al_2O_3$.

10. The organic light-emitting device of claim 5, wherein the multilayer thin film comprises at least one transparent conductive layer.

11. The organic light-emitting device of claim 6, wherein a difference between the highest and the lowest of refractive indices of materials fabricating the multilayer thin film is 1.0 or smaller.

12. The organic light-emitting device of claim 6, wherein a number of layers making up the multilayer thin film is 6 or greater.

13. The organic light-emitting device of claim 6, wherein at least one of layers making up the multilayer thin film comprises at least one of $ZrO_2$ and $Al_2O_3$.

14. The organic light-emitting device of claim 6, wherein the multilayer thin film comprises at least one transparent conductive layer.

15. The organic light-emitting device of claim 2, further comprising third to (n+2)'th reflective mirrors having different reflection characteristics formed on the second reflective mirror.

16. The organic light-emitting device of claim 2, wherein the substrate has a thickness of 5 μm to 10 cm.

17. The organic light-emitting device of claim 2, wherein at least one of the first and second reflective mirrors is a multilayer thin film.

18. The organic light-emitting device of claim 15, wherein at least one of the third to (n+2)'th reflective mirrors is a multilayer thin film.

19. The organic light-emitting device of claim 17, wherein a difference between the highest and the lowest of refractive indices of materials fabricating the multilayer thin film is 1.0 or smaller.

20. The organic light-emitting device of claim 17, wherein a number of layers making up the multilayer thin film is 6 or greater.

21. The organic light-emitting device of claim 17, wherein at least one of layers making up the multilayer thin film comprises at least one of $ZrO_2$ and $Al_2O_3$.

22. The organic light-emitting device of claim 17, wherein the multilayer thin film comprises at least one transparent conductive layer.

23. The organic light-emitting device of claim 18, wherein a difference between the highest and the lowest of refractive indices of materials fabricating the multilayer thin film is 1.0 or smaller.

24. The organic light-emitting device of claim 18, wherein a number of layers making up the multilayer thin film is 6 or greater.

25. The organic light-emitting device of claim 18, wherein at least one of layers making up the multilayer thin film comprises at least one of $ZrO_2$ and $Al_2O_3$.

26. The organic light-emitting device of claim 18, wherein the multilayer thin film comprises at least one transparent conductive layer.

* * * * *